United States Patent [19]
Zappacosta et al.

[11] Patent Number: 5,999,405
[45] Date of Patent: Dec. 7, 1999

[54] PCB MODULE SUPPORT SYSTEM

[75] Inventors: Elisa E Zappacosta, Sioux City; Mark Rapaich, Westfield, both of Iowa

[73] Assignee: Gateway 2000, Inc., North Sioux city, S. Dak.

[21] Appl. No.: 08/851,522

[22] Filed: May 5, 1997

[51] Int. Cl.⁶ .................................................. H05K 7/20
[52] U.S. Cl. .......................... 361/704; 257/718; 361/690
[58] Field of Search .......................... 174/16.3; 257/718, 257/719; 361/690, 704, 707, 709–710, 715, 719–720, 807, 809–811

[56] References Cited

U.S. PATENT DOCUMENTS 5,699,229 12/1997 Brownell ................................. 361/704
5,748,446  5/1998 Feightner et al. ..................... 361/709
5,847,928 12/1998 Hinshaw et al. ....................... 361/704

*Primary Examiner*—Gregory Thompson
*Attorney, Agent, or Firm*—Schwegman, Lundberg, Woessner & Kluth P.A.; Anothony Claiborne

[57] ABSTRACT

A support apparatus is disclosed including a support structure for holding a printed circuit board module, a heat sink thermally coupled with the printed circuit board module, and a capture bar secured to the support structure. The support apparatus includes a holding member with extension members for securing the holding member to the main printed circuit board. The heat sink has a projection extending from one surface, and the capture bar frictionally engages with the projection. Standoffs are disposed between the main printed circuit board and a chassis surrounding the main printed circuit board. A method for cooling the printed circuit board module is also disclosed. The method comprises coupling the printed circuit board module with the holding member, and thermally coupling the heat sink with the printed circuit board module. The capture bar is coupled with the projection of the heat sink and is secured to the holding member. Standoffs are disposed under the main printed circuit board. The extension members of the holding member are secured to the main printed circuit board and to the chassis.

39 Claims, 5 Drawing Sheets

PCB MODULE SUPPORT SYSTEM

FIELD OF THE INVENTION

The present invention relates generally to support structures. More particularly, it pertains to a support structure for internal components of electronic devices.

BACKGROUND OF THE INVENTION

Advances in semiconductor technology are creating increasing heat dissipation problems in electronic components and systems. Because electronic components have a relatively large amount of electrical current flow within an extremely small area, the components generate a relatively substantial amount of heat. In particular, microprocessors tend to generate a significant amount of heat.

The effect of the heat generated is intensified by the close spacing of the components on printed circuit boards and the close spacing of printed circuit boards within electrical devices. Some printed circuit boards are vertically mounted to the main printed circuit board, thereby adding to the number of electronic components in a limited area. The amount of heat generated has increased as electronic components get smaller and more powerful. As a result, more heat is generated in a smaller, more confined area. Excessive heat in a small area degrades system performance and reliability since high temperatures can damage circuitry and adversely affect performance. Thus, heat dissipation methods and devices are critical in the electronics industry.

A variety of well-known methods and devices for dissipating heat are available. These include various finned heat sinks which dissipate heat from the surfaces of metal fins. The finned heat sinks are attached to the electronic component to be cooled and are often used in computer systems with electric fans that drive air over the fins to enhance their cooling effect.

For cooling a heat producing component, the heat sink is thermally coupled with the heat producing component. For vertically mounted printed circuit boards, this creates support problems. The heat sinks have been difficult to mount to a heat producing component due to the weight and size of the heat sink.

One attempt at supporting and cooling a printed circuit board module is by Intel Corporation of Santa Clara, Calif. In this approach, as shown in FIG. 1, the printed circuit board module is supported by a plastic card holder that is attached to the main printed circuit board. A finned heat sink is secured to the printed circuit board module, in part, by screws through the heat sink to the module. A bracket, as shown in FIG. 2, is secured to the main printed circuit board and encompasses the bottom row of fins on the heat sink. One disadvantage with this approach is that the mass of the heat sink puts stress on the printed circuit board module and the main printed circuit board.

Accordingly, what is needed is a better way to provide support for cooling devices for electronic components. What is further needed is a way to support the cooling devices without damaging surrounding components.

SUMMARY OF THE INVENTION

A support apparatus comprises a support structure for providing support to a heat producing component, a heat sink thermally coupled with the heat producing component, and a capture bar secured to the support structure. The support apparatus is secured to a main printed circuit board. The support apparatus includes a holding member with extension members for securing the holding member to the main printed circuit board. In one embodiment, the heat producing component is a printed circuit board module, having a processor mounted thereon. The holding member receives the printed circuit board module therein. The heat sink has a projection extending from one surface, and the capture bar frictionally engages with the projection.

In one embodiment, the capture bar has a cutout therein. The cutout of the capture bar receives the projection of the heat sink therein. In another embodiment, the projection of the heat sink is a hook structure for engaging with the cutout. Alternatively, the hook structure of the heat sink forms an L-shape.

The heat sink is coupled with the heat producing component by engaging the projection of the heat sink with the capture bar. In addition, the heat sink is secured directly to the heat producing component with retaining members, such as screws or rivets. In one embodiment, thermal grease is disposed between the heat sink and the heat producing component.

In another embodiment, at least one standoff is disposed between the main printed circuit board and a chassis surrounding the main printed circuit board. The standoffs are located proximate to the support structure and elevate the main printed circuit board from the chassis, while simultaneously supporting the weight of the heat sink and the printed circuit board module. The standoffs, in one embodiment, are plastic discs.

In another embodiment of the present invention, a method for cooling the printed circuit board is provided. The method comprises coupling the printed circuit board module with the holding member, and thermally coupling the heat sink with the printed circuit board module. The capture bar is coupled with the projection of the heat sink and is secured to the holding member. Standoffs are disposed under the main printed circuit board. The extension members of the holding member are secured to the main printed circuit board and to the chassis.

The support apparatus beneficially provides support to the heat sink and the printed circuit board module by securing them to the computer chassis. The printed circuit board module is isolated from the weight of the heat sink. In addition, the support apparatus alleviates stress to the main printed circuit board from the weight of the heat sink.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

In the drawings, where like numerals describe like components throughout the several views.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. Therefore, the following detailed description is not to be taken in a limiting sense, and the scope of the present invention is defined by the appended claims.

Figure 1:
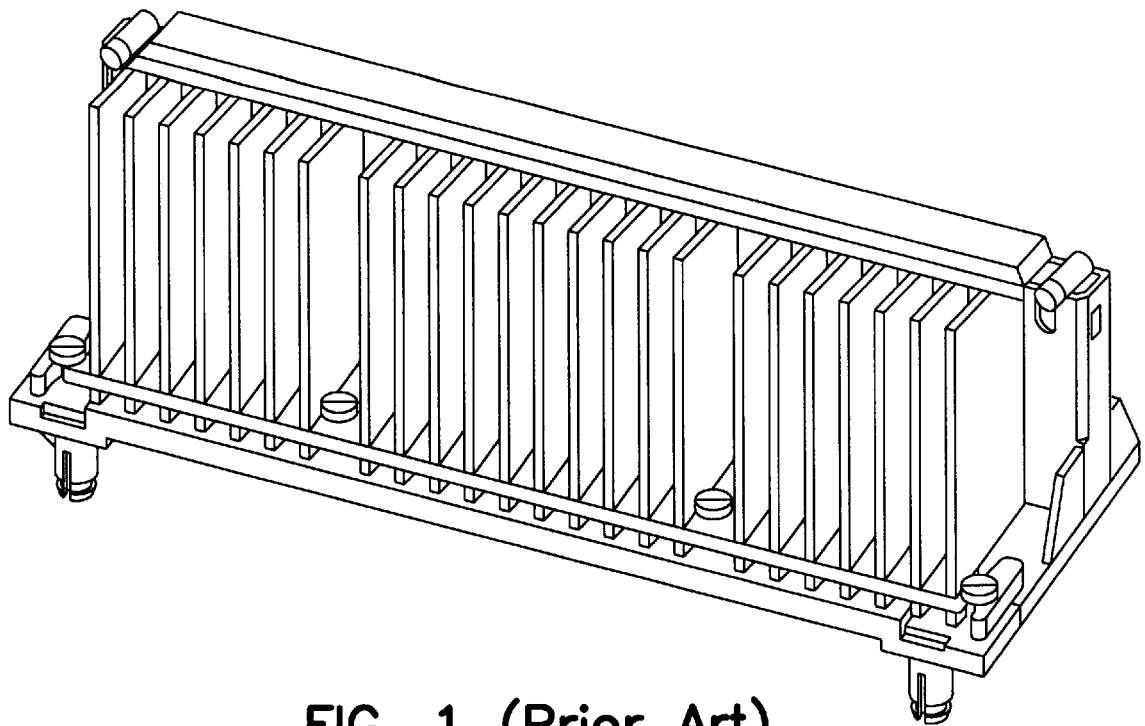
FIG. 1 is a perspective view illustrating a prior art device.
Figure 2:
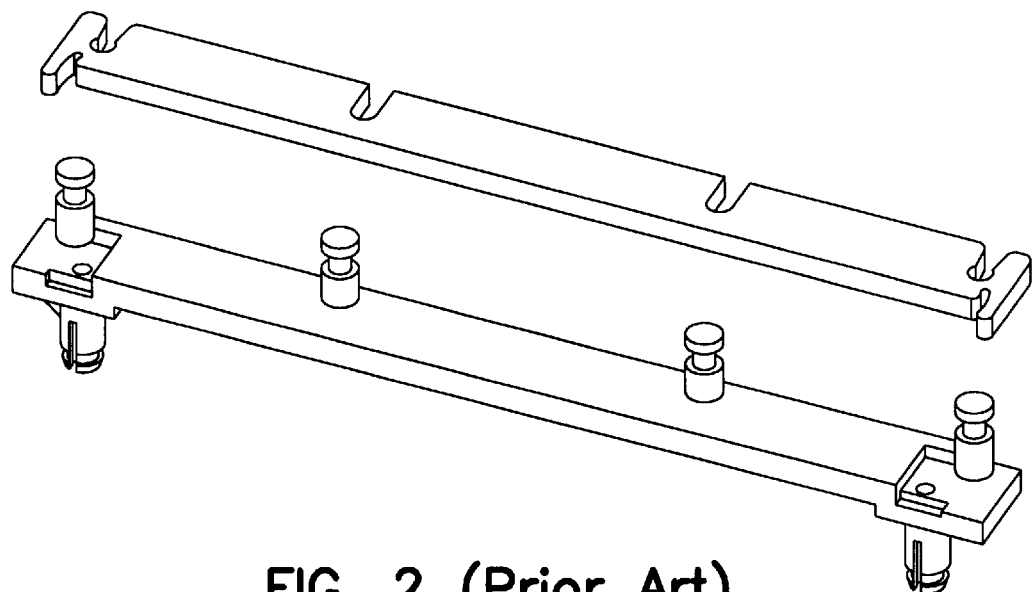
FIG. 2 is an exploded perspective view illustrating a bracket of the prior art device shown in FIG. 1.
Figure 3:
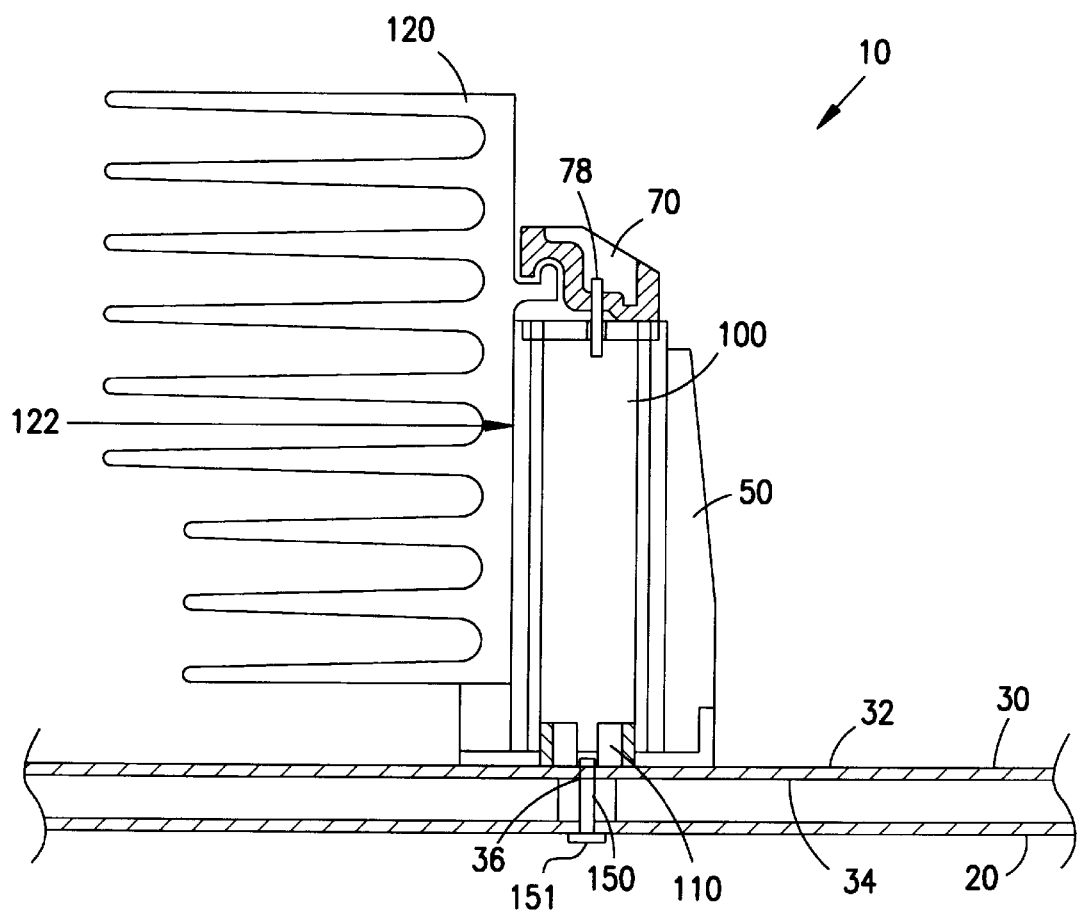
FIG. 3 is a first side elevational view illustrating a support apparatus constructed in accordance with one embodiment of the present invention.

A support system 10 is shown in FIG. 3. The computer system 10 includes a main printed circuit board 30, which includes a memory (not shown). In one embodiment, the processor is mounted on a secondary printed circuit board enclosed in a case, which collectively form a printed circuit board module 100. The main printed circuit board 30 has a first surface 32 and a second surface 34. A chassis 20 encompasses the main printed circuit board 30, which provides support and protection to the electronic components therein. Mounting apertures 36 are provided within the main printed circuit board 30.

Figure 4:
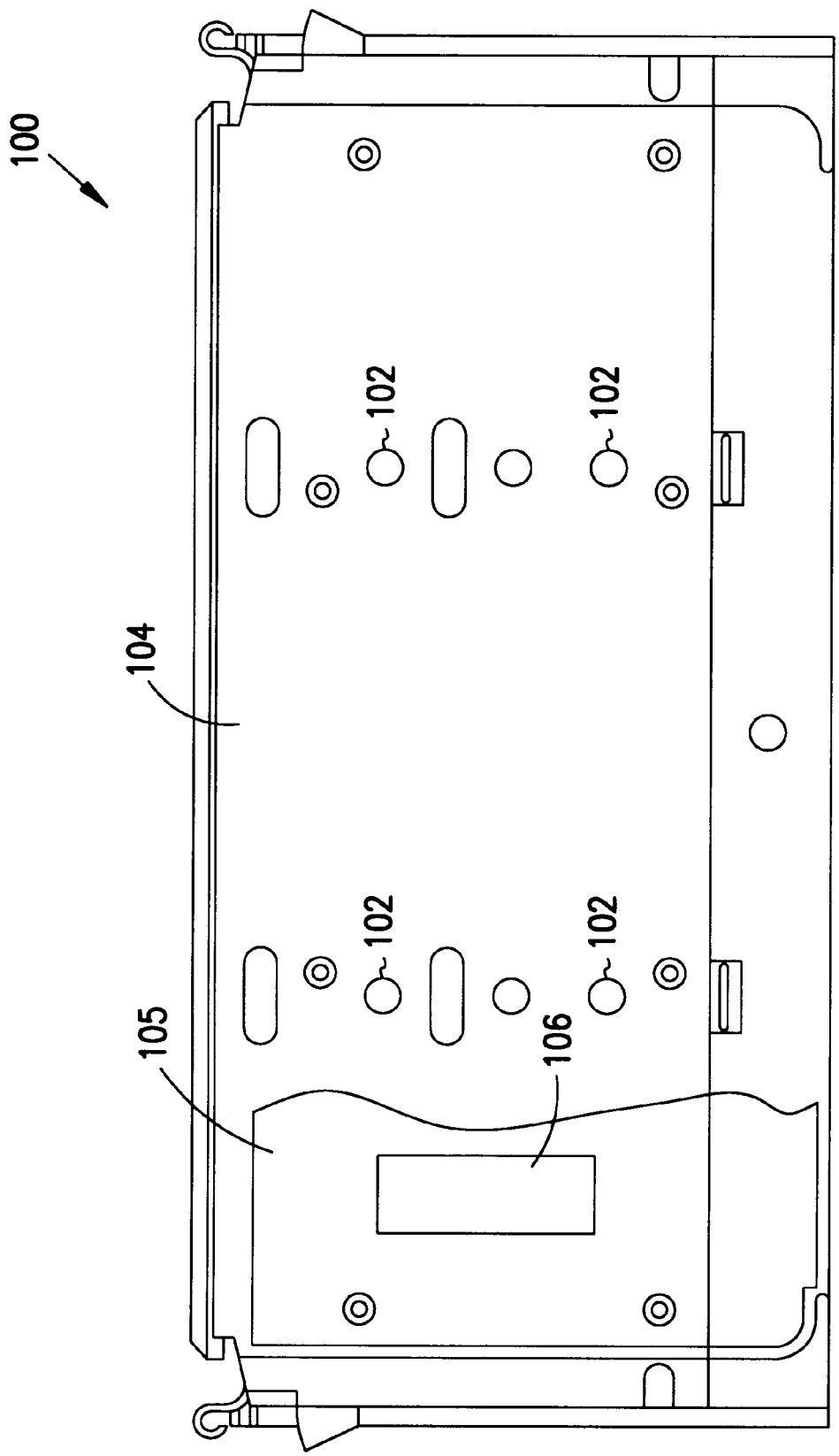
FIG. 4 is a first side elevational view illustrating a printed circuit board module and a broken view of a printed circuit board constructed in accordance with one embodiment of the present invention.

The printed circuit board module 100 is disposed generally perpendicular to the main printed circuit board 30. The printed circuit board module 100 is shown in FIG. 4. The printed circuit board module 100 includes a secondary printed circuit board 105 having a processor 106 disposed thereon. Secondary printed circuit board 105 is shown in a broken away view. A mounting plate 104 is connected with the secondary printed circuit board. The mounting plate 104 is fabricated from metal for facilitating heat transfer to the heat sink 120. The mounting plate 104 has a plurality of apertures 102 for securing the printed circuit board module 100 to the heat sink 120. A holding member 50 is provided for securing the printed circuit board module 100 to the main printed circuit board 30.

Figure 5:
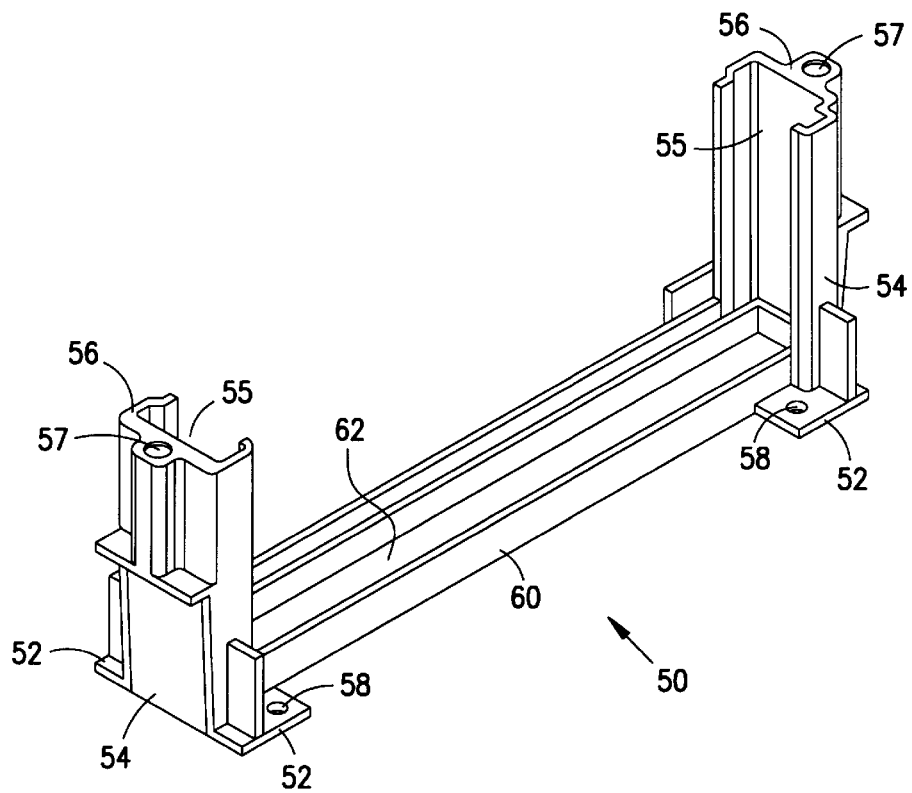
FIG. 5 is a perspective view illustrating a holding member constructed in accordance with one embodiment of the present invention.

FIG. 5 illustrates a detailed view of the holding member 50. The holding member 50 is fabricated from plastic material. The holding member 50 can be formed by injection molding or other plastic formed methods known in the art. Alternatively, the holding member 50 can be fabricated from other materials, including metals. In one embodiment, the holding member 50 is generally U-shaped. Forming the U-shape, two side members 54 extend away from a base member 60. The base member 60 has a cutout 62 for receiving a printed circuit board module connector 110 (FIG. 3) therethrough. Each of the side members 54 have a channel 55 formed therein. The channel 55 of each side member 54 is sized and dimensioned to slidably receive the printed circuit board module 100 therein. The printed circuit board module 100 has sides comprising suitably dimensioned structures for mating with the channels 55. The side members 54 of the holding member 50 each have a first surface 56. In one embodiment, the first surface 56 is parallel to the base member 60. Disposed within the first surface 56 of each side member 54 is a side member aperture 57. The first surface 56 mates with a capture bar 70, which will be further described below.

The base member 60 further comprises at least one extension member 52, which extends generally transverse to the base member 60. In one embodiment, the holding member 50 includes four extension members 52 which are disposed on two opposite sides of the base member 60. Each extension member 52 is generally square shaped, although other shapes are contemplated. Each extension member 52 has an aperture 58 disposed therein. The extension member 52 provides additional support to the printed circuit board module 100, and is used for physically attaching the holding member 50 to the main printed circuit board 30. In one embodiment, the extension members 52 are sized and spaced to distribute weight over a portion of the main printed circuit board 30.

Figure 6:
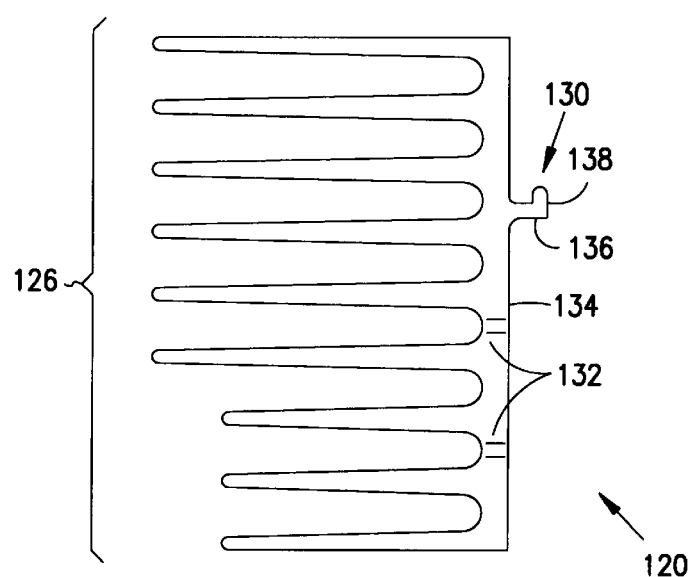
FIG. 6 is a first side elevational view illustrating a heat sink constructed in accordance with one embodiment of the present invention.

For cooling the printed circuit board module 100, a heat sink 120, as illustrated in FIG. 6, is provided. The heat sink 120 has a plurality of fins 126 extending from a mounting surface 134. In one embodiment, the heat sink 120 includes a means for directing an air flow, such as a fan, over the fins 126. The heat sink is extruded from aluminum material. Alternatively, the heat sink 120 can be formed in other heat dissipating shapes, and from other thermally conductive materials, such as copper. For connecting the heat sink 120 to a heat source to be cooled, the mounting surface 134 has at least one aperture 132 disposed therein. In one embodiment, four apertures 132 are disposed within the mounting surface 134. The apertures 132 are sized to receive retaining members therethrough. The apertures 132 align with apertures 102 in the printed circuit board module 100 to facilitate additional support for mounting of the heat sink 120 to the printed circuit board module 100.

Extending from the mounting surface 134 of the heat sink 120 is a mounting ridge 130. The mounting ridge 130 extends in an opposite direction to the fins 126. In one embodiment, the mounting ridge 130 is a flat plate, which extends across the entire surface of the mounting surface 134. Alternatively, the mounting ridge 130 can extend across only a portion of the mounting surface 134, or the ridge 130 can extend on multiple surfaces. In another embodiment, the mounting ridge 130 forms a hook structure. The mounting ridge 130 has a first portion 136 which extends generally transverse to the mounting surface 134. A second portion 138 extends from the first portion 136. The second portion 138 is generally parallel to the mounting surface 134, thereby forming a hook structure. The mounting ridge 130 can be formed in other shapes for creating a hook structure, such as a curved shape, without departing from the scope of the present invention.

The heat sink 120 is coupled with the printed circuit board module 100 and provides heat dissipation of heat generated by the printed circuit board module 100. Thermal grease 122 is disposed between the mounting surface 134 of the heat sink 120 and the printed circuit board module 100 for facilitating a thermal path away from the printed circuit board module 100. Alternatively, thermal cement or other equivalents can be disposed between the heat sink 120 and the printed circuit board module 100. The heat sink 120 provides for additional heat dissipation from the printed circuit board module 100 since the mounting surface 134 substantially covers the mounting plate 104 of the printed circuit board module 100.

Figure 7:
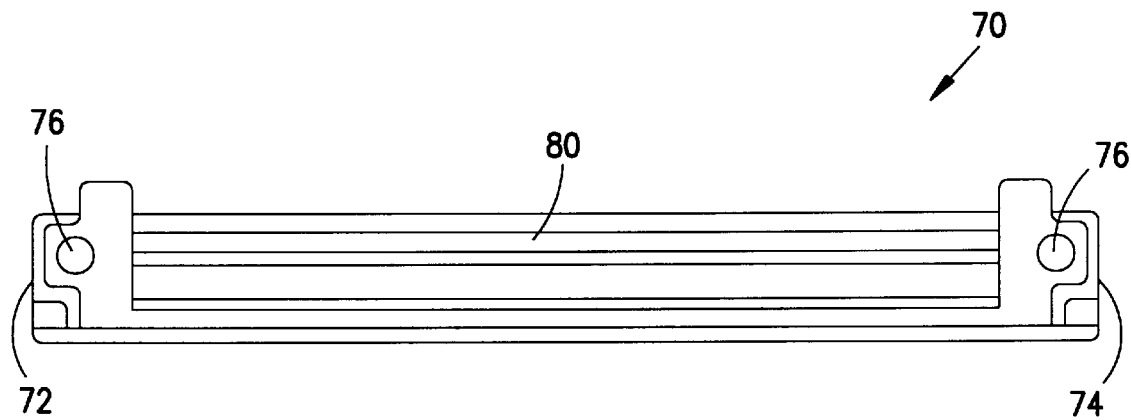
FIG. 7 is a bottom plan view illustrating a capture bar constructed in accordance with one embodiment of the present invention.

A capture bar 70 is illustrated in FIG. 7. Secured to first surface 56 of the holding member 50, the capture bar 70 couples the heat sink to the holding member 50. The capture bar 70 extends from a first end 72 to a second end 74. The first and second ends 72, 74 each have an aperture 76 disposed therein. The apertures 76 align with apertures 57 when the capture bar 70 is secured to the holding member 50 with screws or other attachment members. The capture bar 70 also has a cut out 80 therein. The cut out 80 is sized to receive the mounting ridge 130 of the heat sink 120 therein when the capture bar 70 is coupled to the holding member 50.

Figure 8:
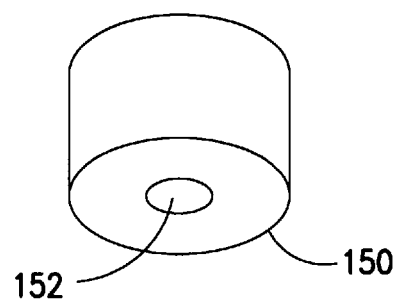
FIG. 8 is a perspective view illustrating a standoff constructed in accordance with one embodiment of the present invention.

A standoff 150 is illustrated in FIG. 8. The standoff 150 is generally disc-shaped and has a bore 152 disposed therethrough. The bore 152 is aligned with a radial axis of the standoff 150. The bore 152 is sized to receive a retaining member, such as a screw, therein. The standoff 150 is fabricated from plastic, although other materials are suitable for use with the present invention. As shown in FIG. 3, the standoff 150 is disposed between the main printed circuit board 30 and the chassis 20. Disposing the standoff 150 adjacent to the printed circuit board module 100 and between the main printed circuit board 30 and the chassis 20 provides additional support to the printed circuit board module 100 and the heat sink 120 via the holding member 50. The standoff 150 also alleviates stress from the main printed circuit board 30 since the holding member 50 can be secured to the chassis 20 without flexing the main printed circuit board 30.

The printed circuit board module 100 is disposed within the channels 55 of the holding member 50. The mounting ridge 130 of the heat sink 120 is placed on the printed circuit board module 100 such that the mounting surface 134 abuts the mounting plate 104 of the printed circuit board module 100. Retaining members, such as screws, are disposed through the apertures 132 on the heat sink and into the apertures 102 on the printed circuit board module. The capture bar 70 is disposed over the mounting ridge 130 of the heat sink 120, where the mounting ridge 130 is received by cut out 80 of the capture bar 70. The capture bar 70 is secured to the holding member 50 by retaining members 78, such as screws, inserted into aperture 76 of the capture bar 70 and side member apertures 57 of the holding member 50.

The holding member 50 is coupled with the first surface 32 of the main printed circuit board 30. The base member 60 is placed adjacent to the first surface 32 where the apertures 58 of the extension members 52 align with the mounting apertures 36 of the main printed circuit board 30. The bore 152 of the standoff 150 is aligned with the mounting apertures 36, and a retaining member 151, such as a screw, secures the holding member 50 with the main printed circuit board 30 and the chassis 20. Advantageously, the holding member 50, capture bar 70, and the standoff 150 relieve stress that would otherwise be placed directly on the printed circuit board module 100 or the main printed circuit board 30.

In one embodiment of the present invention, a method is provided for mounting a cooling apparatus to the printed circuit board module with less stress. The method comprises the steps of coupling the printed circuit board module 100 with the holding member 50, placing the heat sink 120 adjacent to the processor module and disposing thermal grease therebetween. The capture bar 70 is coupled with the mounting ridge of the heat sink 120 and is secured to the holding member 50 with screws. The standoffs 150 are disposed under the main printed circuit board 30, where the radial axis 154 of the standoffs 150 are aligned with the radial axis of each aperture 58 of the extension members 52. The extension member 52 are secured to the main printed circuit board 30 and to the chassis 20. To secure the holding member 50 to the chassis 20, a retaining member, such as a screw, is inserted through the aperture 58 of the extension member 52, through the mounting aperture 36 of the main printed circuit board 30, through the bore 152 of the standoff 150 to connect with the chassis 20.

The support system 10 advantageously provides increased heat dissipation and increased support to the printed circuit board module. The support apparatus provides support to the heat sink and the printed circuit board module by securing them to the computer chassis. The mounting ridge provides increased thermal coupling between the heat sink and the printed circuit board module, which allows increased heat dissipation. In addition, the support apparatus alleviates stress to the main printed circuit board from the weight of the heat sink.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A support apparatus comprising:
    a U-shaped support structure for providing support to a heat producing component;
    a heat sink adapted to be thermally coupled with the heat producing component, the heat sink having a projection on a non-finned surface of the heat sink;
    a capture bar secured to the support structure, the capture bar engaged with the projection.

2. The support apparatus as recited in claim 1, wherein the projection of the heat sink comprises a plate extending from a surface of the heat sink.

3. The support apparatus as recited in claim 1, wherein the projection of the heat sink comprises an L-shaped structure.

4. The support apparatus as recited in claim 1, wherein the capture bar has a cut out disposed therein, said cut out for receiving the projection therein.

5. A printed circuit board module support system comprising:
    a main printed circuit board;
    a holding member coupled with said main printed circuit board;
    a printed circuit board module coupled with said holding member and the main printed circuit board;
    a heat sink thermally coupled with the printed circuit board module; and
    a capture bar secured to a portion of the holding member away from the main printed circuit board, said capture bar coupled with a portion of the heat sink.

6. The printed circuit board module support system as recited in claim 5, wherein the printed circuit board module includes a processor mounted on a secondary printed circuit board.

7. The printed circuit board module support system as recited in claim 5, wherein the printed circuit board module is substantially transverse to the main printed circuit board.

8. The printed circuit board module support system as recited in claim 5, wherein the holding member has at least one extension member for securing the holding member to the main printed circuit board.

9. The printed circuit board module support system as recited in claim 8, wherein each of the at least one extension members extends out away from the holding member.

10. A printed circuit board module support system as recited in claim 5, wherein the holding member has a generally U-shaped structure for encompassing a portion of an outer perimeter of the printed circuit board module.

11. The printed circuit board module support system as recited in claim 5, wherein the portion of the heat sink coupled with the capture bar includes a mounting ridge disposed on at least one surface of the heat sink.

12. The printed circuit board module support system as recited in claim 11, wherein the capture bar has a cut out disposed therein, said cut out for mating with at least a portion of said mounting ridge.

13. The printed circuit board module support system as recited in claim 12, wherein the mounting ridge comprises a first portion extending from the at least one surface of the heat sink, and a second portion extending from the first portion, the first portion and the second portion forming a hook structure, said hook structure matably engaged with said cut out.

14. The printed circuit board module support system as recited in claim 5, wherein the heat sink and the printed circuit board module have thermally conductive material disposed therebetween.

15. The printed circuit board module support system as recited in claim 10, wherein the heat sink comprises an aluminum extrusion.

16. A printed circuit board module support system as recited in claim 5, wherein the main printed circuit board has a first surface and a second surface, the support system further comprising at least one standoff disposed proximate to the second surface of the main printed circuit board, the standoff for supporting the main printed circuit board.

17. The printed circuit board module support system as recited in claim 16, wherein each of the at least one standoffs comprises a predetermined shape having a bore therethrough.

18. The printed circuit board module support system as recited in claim 17, wherein the predetermined shape comprises a disc.

19. A printed circuit board module support system as recited in claim 5, wherein the portion of the heat sink coupled with the capture bar comprises a mounting device attached to the heat sink.

20. The printed circuit board module support system as recited in claim 19, wherein the mounting device comprises a ridge extending from a surface of the heat sink.

21. The printed circuit board module support system as recited in claim 19, wherein the mounting device comprises a hook structure.

22. The printed circuit board module support system as recited in claim 21, wherein the hook structure is generally L-shaped.

23. The printed circuit board module support system as recited in claim 19, wherein the mounting device has a projection integral therewith.

24. A printed circuit board module support system as recited in claim 23, wherein the capture bar has a cut out disposed therein, said projection matably engaged with said cut out.

25. The printed circuit board module support system as recited in claim 19, wherein the holding member includes two side members, where the two side members hold a portion of the printed circuit board module.

26. The printed circuit board module support system as recited in claim 25, wherein the capture bar extends from a first end to a second end, the capture bar having a first aperture disposed in the first end and a second aperture disposed in the second end, and wherein a radial axis of the side member apertures are aligned with a radial axis of the capture bar apertures.

27. The printed circuit board module support system as recited in claim 26, wherein a retaining member is disposed in both the first and second apertures of the capture bar, said retaining members for securing the capture bar to the holding member.

28. A computer system comprising:
   a main printed circuit board having a first surface and a second surface;
   a holding member disposed adjacent to a first surface of the main printed circuit board;
   a printed circuit board module having a processor therein, said printed circuit board module communicatively coupled with the main printed circuit board, the printed circuit board module coupled with the holding member;
   a heat sink thermally coupled with the printed circuit board module;
   a capture bar secured to the holding member, the capture bar coupled with a portion of the heat sink;
   at least one standoff disposed adjacent to the second surface of the main printed circuit board;
   a chassis encompassing the main printed circuit board; and
   at least one retaining member disposed through the holding member and the main printed circuit board, said retaining member secured to the chassis.

29. The computer system as recited in claim 28, wherein the standoff separates the second surface of the main printed circuit board from the chassis.

30. The computer system as recited in claim 28, wherein the heat sink thermally coupled with the printed circuit board module comprises the heat sink retentatively coupled with the printed circuit board module.

31. A method for cooling a processor module, the method comprising the steps of:
   securing a holding member to a main printed circuit board;
   coupling said processor module with said holding member;
   placing a heat sink adjacent to the processor module;
   coupling a capture bar with a portion of the heat sink; and
   securing the capture bar to the holding member so as to retain the heat sink in thermal communication with said processor module.

32. The method as recited in claim 31, wherein the step of coupling a capture bar with a portion of the heat sink includes the step of engaging the capture bar with a portion of the heat sink.

33. The method as recited in claim 31, wherein the step of coupling the processor module with the holding member includes the step of sliding the processor module within the holding member.

34. The method as recited in claim 31, wherein the step of placing the heat sink adjacent to the processor module includes the step of thermally coupling the heat sink with the processor module.

35. A method for cooling a processor module within a chassis, the method comprising the steps of:

coupling said processor module with a holding member;

placing a heat sink adjacent to the processor module;

coupling a capture bar with a portion of the heat sink;

securing the capture bar to the holding member, thereby forming a heat sink assembly;

disposing at least one standoff between a main printed circuit board and the chassis, the main printed circuit board having a first side and a second side; said standoff adjacent to the first side of the main printed circuit board;

placing the heat sink assembly proximate to the second side of the main printed circuit board; and securing the heat sink assembly with the chassis.

36. The method as recited in claim 35, wherein the step of securing the heat sink assembly with the chassis includes the steps of:

inserting at least one retaining member through the holding member, the main printed circuit board, and the standoff; and affixing the retaining member to the chassis.

37. The method as recited in claim 35, wherein the step of placing the heat sink adjacent to the processor module includes the step of affixing the heat sink to the processor module.

38. The method as recited in claim 35, wherein the step of affixing the heat sink to the processor module includes the step of disposing thermally conductive material between the heat sink and the processor module.

39. A printed circuit board module support system comprising:

a main printed circuit board;

a holding member coupled with said main printed circuit board, the holding member having two side members, the two side members are defined in part by a first surface;

a printed circuit board module coupled with said holding member and the main printed circuit board, the two side members hold a portion of the printed circuit board module;

a heat sink thermally coupled with the printed circuit board module; and a capture bar secured to the holding member, said capture bar coupled with a mounting device attached to the heat sink, the capture bar resting against said first surface of the two side members, the first surface of each side member having an aperture disposed therein.

* * * * *